(12) United States Patent
Fan

(10) Patent No.: US 8,695,213 B2
(45) Date of Patent: Apr. 15, 2014

(54) LAYOUT METHOD OF TOUCH PANEL ELECTRODE

(76) Inventor: Li-Li Fan, Taoyuan County (TW)

( * ) Notice: Subject to any disclaimer, the term of this patent is extended or adjusted under 35 U.S.C. 154(b) by 349 days.

(21) Appl. No.: 12/929,217

(22) Filed: Jan. 10, 2011

(65) Prior Publication Data

US 2012/0175150 A1      Jul. 12, 2012

(51) Int. Cl.
*H05K 3/02*      (2006.01)
(52) U.S. Cl.
USPC ............... 29/846; 29/835; 29/830; 345/173; 345/177
(58) Field of Classification Search
USPC ................ 29/825, 830, 846; 345/173, 177
See application file for complete search history.

(56) References Cited

U.S. PATENT DOCUMENTS

| | | | | |
|---|---|---|---|---|
| 3,757,322 A | * | 9/1973 | Barkan et al. | 345/174 |
| 6,208,402 B1 | * | 3/2001 | Tajima | 349/156 |
| 6,965,375 B1 | * | 11/2005 | Gettemy et al. | 345/173 |

* cited by examiner

*Primary Examiner* — Carl Arbes
(74) *Attorney, Agent, or Firm* — C. G. Mersereau; Nikolai & Mersereau, P.A.

(57) ABSTRACT

A layout method of a touch panel electrode includes the steps of: providing a substrate; forming a first electro-conductive layer, having pattern blocks disposed adjacently to one another, on one side of the substrate, wherein the first electro-conductive layer is transparent; forming an alignment film on the one side of the substrate; forming an second electro-conductive layer, having wires to be connected to at least one of the pattern blocks, on the one side of the substrate; and forming a protection layer on the second electro-conductive layer to protect the second electro-conductive layer. The present invention can reduce the processes of manufacturing the conventional electrode, especially do not needs to form another electro-conductive layer and another protection layer on the other side of the substrate, and can effectively prevent the electrostatic charge effect and increase the capacitance and sensitivity.

7 Claims, 4 Drawing Sheets

LAYOUT METHOD OF TOUCH PANEL ELECTRODE

BACKGROUND OF THE INVENTION (1) Field of the Invention

The present invention relates to a layout method and a structure of a touch panel electrode, and more particularly to use the minimum manufacturing process structure to achieve the character of an electrode with bridge trench.

(2) Description of the Prior Art

In conventional, the manufacturing process of touch panel is provided to form two electrodes extending in different axial directions on a substrate, and an insulating layer is further formed on one of the electrodes to provide the electrical connection of the other of the electrodes through the metal wires disposed on the insulating layer. However, the conventional metal wires on the insulating layer may be damaged by the subsequent manufacturing processes and thus cannot provide the electrical connections so that the manufacturing yield of the touch panel is decreased.

In some prior arts, the metal wires may be disposed in bridge trench so that the metal wires cannot be damaged. In another word, a novel structure necessary is provided for effectively increasing the yield of the touch panel.

SUMMARY OF THE INVENTION

It is therefore an object of the present invention to provide a layout method of a touch panel electrode having an electrode with bridge trench to achieve the same effect with the minimum manufacturing processes, and to provide a touch panel electrode structure for achieving the same touch effect by simplifying or reducing the conventionally manufactured structure.

To achieve the above-identified object, the present invention provides a layout method of a touch panel electrode. The method includes the steps of: (1) providing a substrate; (2) forming a first electro-conductive layer on one side of the substrate, and the first electro-conductive layer has a plurality of pattern blocks disposed adjacently to one another, wherein the first electro-conductive layer is transparent; (3) forming an alignment film on the one side of the substrate; (4) forming an second electro-conductive layer on the one side of the substrate, wherein the second electro-conductive layer has a plurality of wires connected to at least one of the pattern blocks; and (5) forming a protection layer on the second electro-conductive layer to protect the second electro-conductive layer.

To achieve the above-identified object, the present invention further provides a touch panel electrode structure including a substrate layer, an alignment film, a first electro-conductive layer, a second electro-conductive layer and a protection layer. The alignment film is disposed on one side of the substrate layer. The first electro-conductive layer is disposed on one side of the alignment film, wherein the first electro-conductive layer has a plurality of pattern blocks disposed adjacently to one another. The second electro-conductive layer is disposed adjacently to the other side of the alignment film. The protection layer is disposed on the second electro-conductive layer.

Compared with the prior art, the layout method and structure of the touch panel electrode of the present invention are achieved using only single electro-conductive layer and single protection layer in conjunction with the substrate layer, the another electro-conductive layer and the alignment film. In addition, provide external electro-conductive layer without the pattern block may also be formed on the other side of the substrate layer concurrently with the formation of the more electro-conductive layer so that a protection layer can be formed on the other side of the substrate layer, and an outer frame wire layer can be formed between the substrate layer and the protection layer. So, using the simplified manufacturing processes of the present invention still can have the effect of the conventional touch panel. In addition to the effectively reduced manufacturing cost, the electrostatic charge effect may also be effectively avoided and the capacitance and sensitivity thereof may also be increased.

DETAILED DESCRIPTION OF THE PREFERRED EMBODIMENTS

Figure 1:
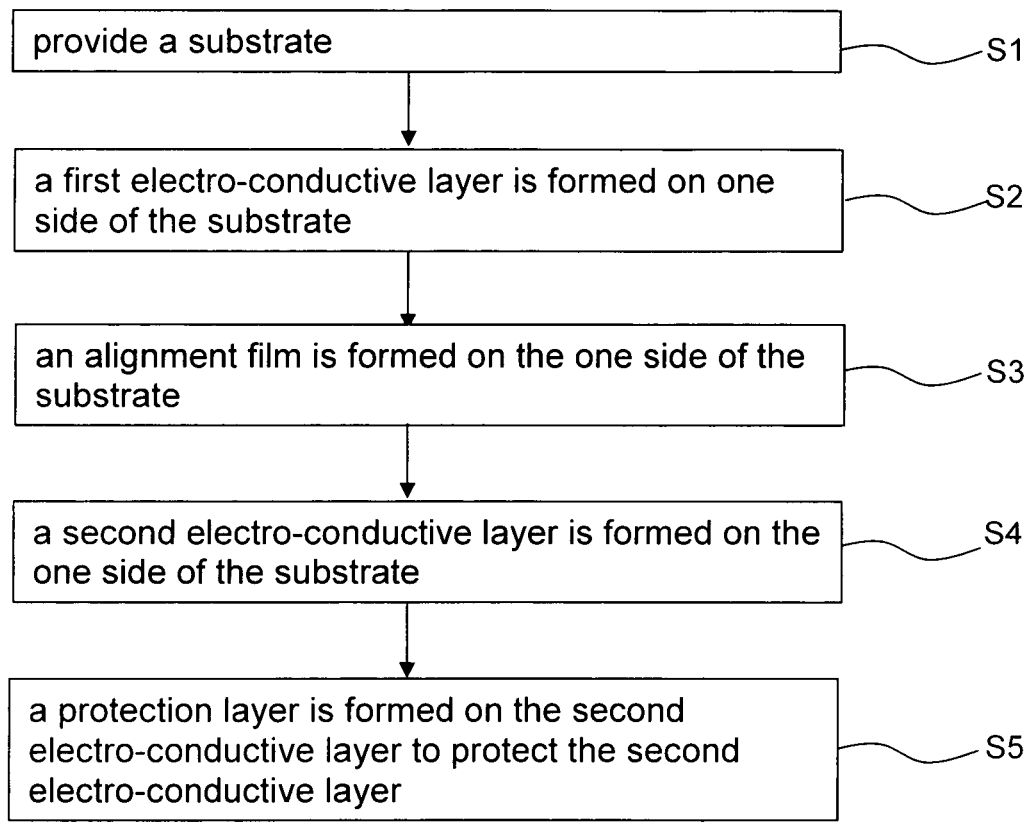
FIGS. 1 to 4 are schematic flow charts showing a layout method of a touch panel electrode according to the present invention.

FIGS. 1 to 4 are schematic flow charts showing a layout method of a touch panel electrode according to an embodiment of the present invention. In FIG. 1, the layout method of the touch panel electrode structure starts from step S1 for providing a substrate. Next, in step S2, a first electro-conductive layer, having a plurality of pattern blocks disposed adjacently to one another, is formed on one side of the substrate, where the first electro-conductive layer is transparent. Then, in step S3, an alignment film is formed on the one side of the substrate. Next, in step S4, a second electro-conductive layer, having a plurality of wires connected to at least one of the pattern blocks, is formed on the one side of the substrate. Next, in step S5, a protection layer is formed on the second electro-conductive layer to protect the second electro-conductive layer.

In another embodiment, the wires of the second electro-conductive layer are formed through an optically compensated mask in conjunction with at least one of over exposure and over development. Furthermore, the layout method further includes the step of forming an outer frame wire layer between the substrate and the protection layer; forming an third electro-conductive layer on the other side of the substrate, wherein the third electro-conductive layer does not have the pattern block and shields the substrate, wherein the third electro-conductive layer is transparent; and forming a plurality of bridge trench in the alignment film, wherein the bridge trench cross between the pattern blocks, and the wires are respectively correspondingly disposed over the bridge trench.

Figure 2:
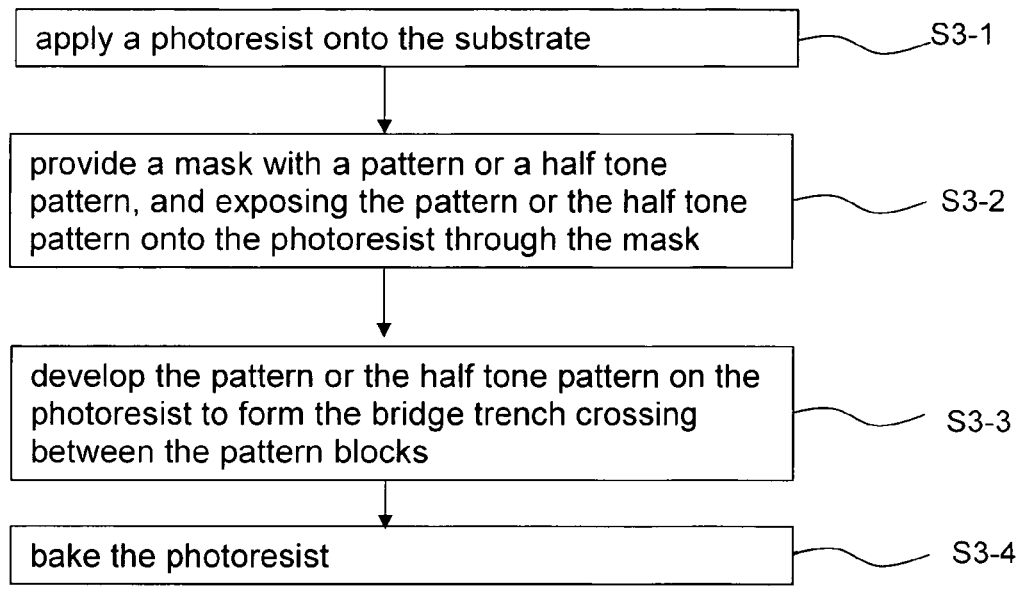

Furthermore, FIG. 2 shows the detailed steps of the step S3. The step of forming the alignment film includes: the step S3-1 of applying a photoresist onto the substrate; the step S3-2 of providing a mask with a pattern or a half tone pattern, and exposing the pattern or the half tone pattern onto the photoresist through the mask; the step S3-3 of developing the pattern or the half tone pattern on the photoresist to form the bridge trench crossing between the pattern blocks; and then the step S3-4 of baking the photoresist.

It is to be noted that the step of forming the mask with the half tone pattern includes the steps of: providing opaque regions of a surface of the mask having line width greater than line widths of the half tone pattern or forming a plurality of voids (having circular, rectangular or any other shapes) evenly on the surface of the mask. Through the exposure, the interference and diffraction caused by the light beams on the half tone pattern make the photoresist of the bridge trench be lower than the height of the bridging insulation unit after development.

Figure 3:
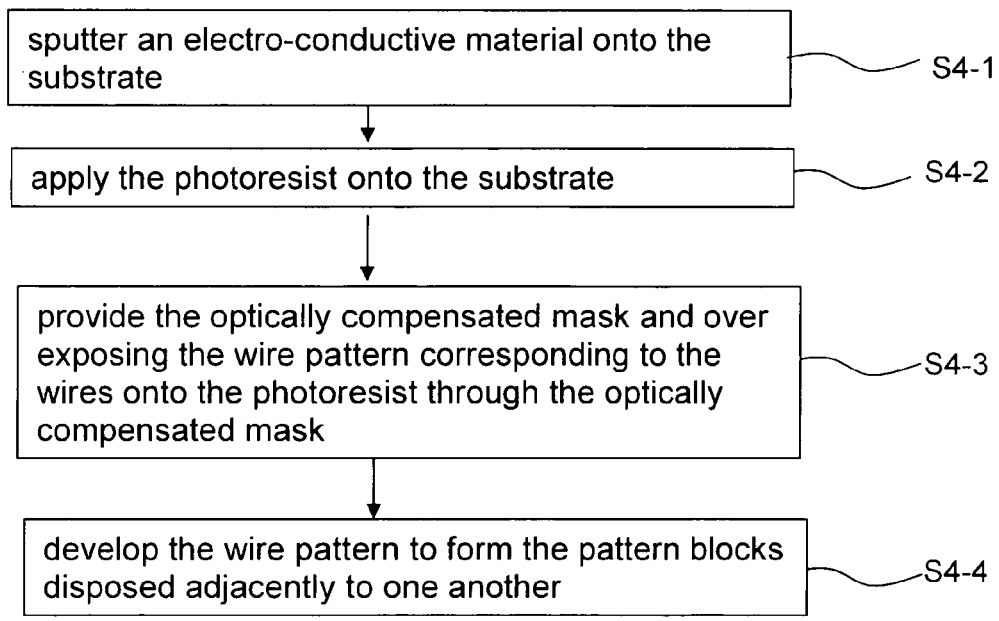

FIG. 3 shows the detailed steps of the step S4. The step of forming the second electro-conductive layer includes: the step S4-1 of sputtering an electro-conductive material onto the substrate; the step S4-2 of applying the photoresist onto the substrate; the step S4-3 of providing the optically compensated mask and over exposing the wire pattern corresponding to the wires onto the photoresist through the optically compensated mask; and then the step S4-4 of developing the wire pattern to form the pattern blocks disposed adjacently to one another, wherein the wire pattern is formed by way of the over exposure and the over development.

Figure 4:
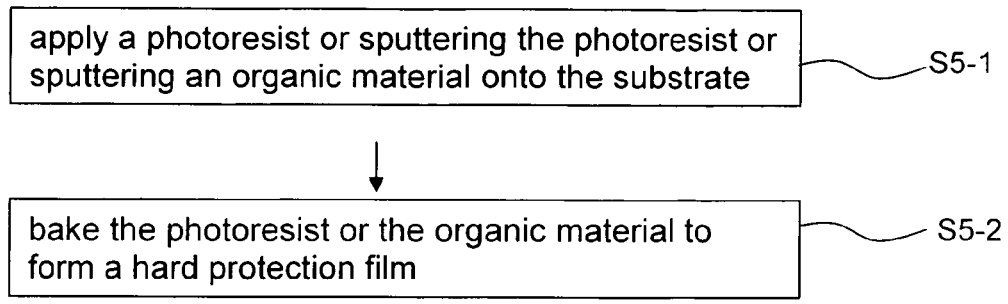

FIG. 4 shows the detailed steps of the step S5, further includes: the step S5-1 of applying a photoresist or sputtering the photoresist or sputtering an organic material onto the substrate; and the step S5-2 of baking the photoresist or the organic material to form a hard protection film.

Figure 5:
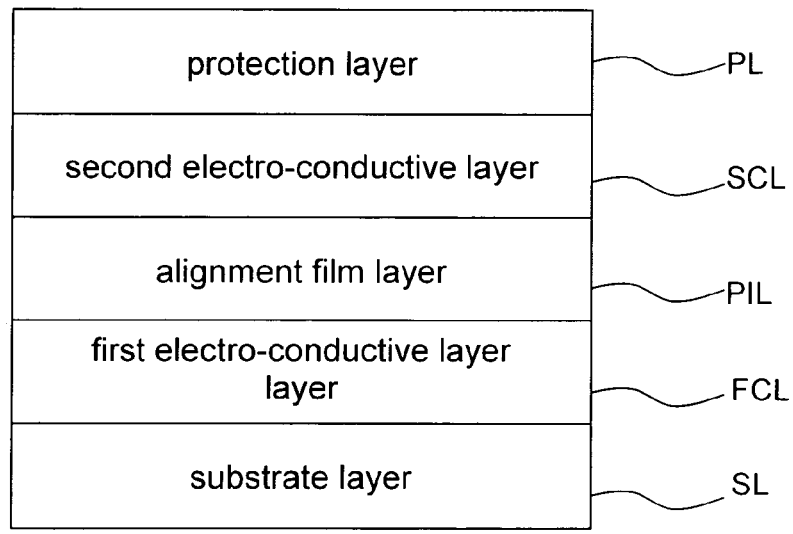
FIGS. 5 and 6 are schematically vertical cross-sectional views showing an electrode structure of a touch panel.

FIG. 5 is a vertically schematically cross-sectional view showing a touch panel electrode structure according to the embodiment of the present invention. In this embodiment, the touch panel electrode structure is used in a touch panel and includes a substrate layer SL, a first electro-conductive layer FCL, an alignment film PIL, a second electro-conductive layer SCL and a protection layer PL. The alignment film PIL is disposed on one side of the substrate layer SL. The first electro-conductive layer FCL is disposed on one side of the alignment film PIL, and the first electro-conductive layer FCL has a plurality of pattern blocks disposed adjacently to one another, where the first electro-conductive layer FCL is transparent. The second electro-conductive layer SCL is disposed adjacently to the other side of the alignment film PIL. The protection layer PL is disposed on the second electro-conductive layer SCL.

Figure 6:
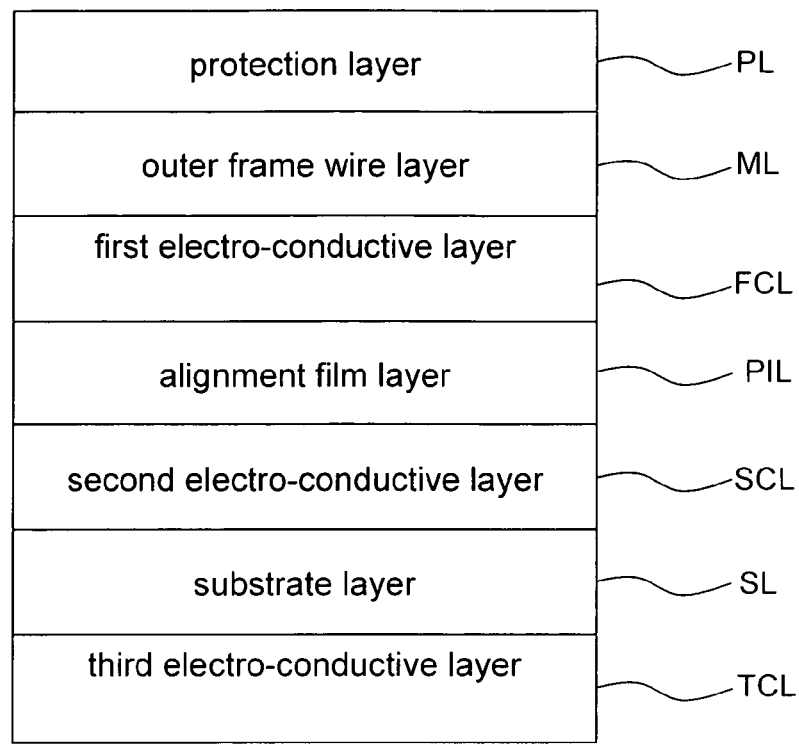
Figure 7:
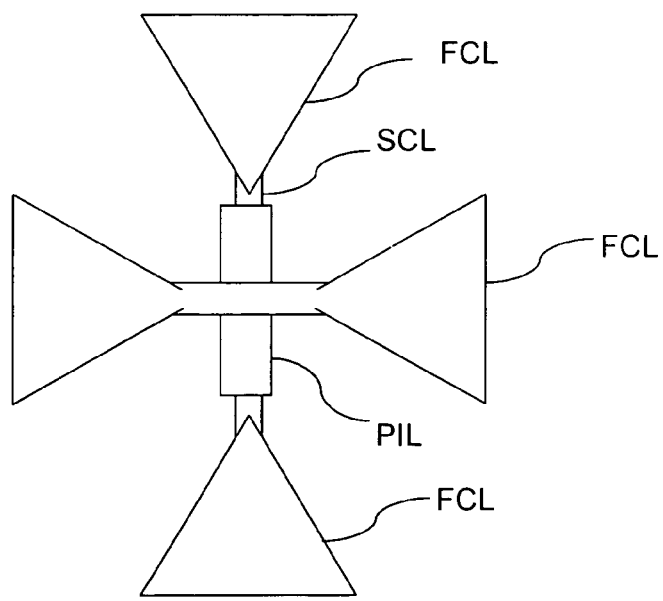
FIG. 7 is a top view showing the electrode structure of the touch panel.

Moreover, as shown in FIG. 6, the touch panel electrode structure further includes an outer frame wire layer ML disposed between the substrate SL and the protection layer PL, wherein an third electro-conductive layer TCL disposed on the other side of the substrate layer SL, and the third electro-conductive layer TCL does not have the pattern block. Furthermore, the third electro-conductive layer TCL is transparent. The schematic illustration of the structures of the substrate layer SL, the first electro-conductive layer FCL, the alignment film PIL, the second electro-conductive layer SCL and the third electro-conductive layer TCL are illustrated in FIG. 7.

However, it is to be noted that FIGS. 5 and 6 are described for the illustrative purpose only. In other words, the scope of the simplified structure of the present invention also includes the embodiment having various layers partially re-arranged to achieve the effect the same as the conventional touch panel.

Compared with the prior art, the layout method and structure of the touch panel electrode of the present invention are achieved using only single electro-conductive layer and single protection layer in conjunction with the substrate layer, the another electro-conductive layer and the alignment film. In addition, provide external electro-conductive layer without the pattern block may also be formed on the other side of the substrate layer concurrently with the formation of the more electro-conductive layer so that a protection layer can be formed on the other side of the substrate layer, and an outer frame wire layer can be formed between the substrate layer and the protection layer. So, using the simplified manufacturing processes of the present invention still can have the effect of the conventional touch panel. In addition to the effectively reduced manufacturing cost, the electrostatic charge effect may also be effectively avoided and the capacitance and sensitivity thereof may also be increased.

New characteristics and advantages of the invention covered by this document have been set forth in the foregoing description. It is to be expressly understood, however, that the drawings are for the purpose of illustration only and are not intended as a definition of the limits of the invention. Changes in methods, shapes, structures or devices may be made in details without exceeding the scope of the invention by those who are skilled in the art. The scope of the invention is, of course, defined in the language in which the appended claims are expressed.

What is claimed is:

1. A layout method of a touch panel electrode, the method comprising the steps of:
   providing a substrate;
   forming a first electro-conductive layer, having a plurality of pattern blocks disposed adjacently to one another, on one side of the substrate, wherein the first electro-conductive layer is transparent;
   forming an alignment film on the one side of the substrate;
   forming an second electro-conductive layer, having a plurality of wires connected to at least one of the pattern blocks, on the one side of the substrate;
   forming a protection layer on the second electro-conductive layer to protect the second electro-conductive layer;
   forming an outer frame wire layer between the substrate and the protection layer; and
   forming a third electro-conductive layer on the other side of the substrate, wherein the third electro-conductive layer does not have a pattern block and shields the substrate and the third electro-conductive layer is transparent.

2. A layout method of a touch panel electrode, the method comprising the steps of:
   forming a first electro-conductive layer, having a plurality of pattern blocks disposed adjacently to one another, on one side of the substrate, wherein the first electro-conductive layer is transparent;
   forming an alignment film on the one side of the substrate;
   forming a second electro-conductive layer, having a plurality of wires connected to at least one of the pattern blocks, on the one side of the substrate; and
   forming a protection layer on the second electro-conductive layer to protect the second electro-conductive layer;
   wherein a plurality of bridge trench is formed in the alignment film and crosses between the pattern blocks, and the wires are respectively correspondingly disposed above the bridge trench.

3. The method according to claim 2, wherein the wires of the second electro-conductive layer are formed through an optically compensated mask in conjunction with at least one of over exposure and over development.

4. The method according to claim 3, wherein the step of forming the alignment film comprises:
   applying a photoresist onto the substrate;
   providing a mask with a pattern and exposing the pattern onto the photoresist through the mask;
   developing the pattern on the photoresist to form bridge trench crossing between the pattern blocks; and
   baking the photoresist.

5. The method according to claim 4, wherein the mask is a half tone pattern.

6. The method according to claim 4, wherein the step of forming the second electro-conductive layer comprises:
- sputtering an electro-conductive material onto the substrate;
- applying a photoresist onto the substrate;
- providing the optically compensated mask and over exposing a wire pattern corresponding to the wires onto the photoresist through the optically compensated mask; and
- developing the wire pattern to form the pattern blocks disposed adjacently to one another, wherein the wire pattern is formed by way of over exposure and over development.

7. The method according to claim 6, wherein the step of forming the protection layer comprises:
- applying a photoresist or sputtering the photoresist or sputtering an organic material onto the substrate; and
- baking the photoresist or the organic material to form a hard protection film.

* * * * *